(12) United States Patent
Lin (10) Patent No.: US 9,117,750 B2
(45) Date of Patent: Aug. 25, 2015

(54) RESISTIVE ELEMENT AND MEMORY CELL OF NON-VOLATILE MEMORY AND MANUFACTURING METHOD THEREOF

(71) Applicant: Chrong-Jung Lin, Hsinchu (TW)

(72) Inventor: Chrong-Jung Lin, Hsinchu (TW)

( * ) Notice: Subject to any disclaimer, the term of this patent is extended or adjusted under 35 U.S.C. 154(b) by 0 days.

(21) Appl. No.: 14/325,836

(22) Filed: Jul. 8, 2014

(65) Prior Publication Data

US 2015/0206924 A1    Jul. 23, 2015

(30) Foreign Application Priority Data

Jan. 23, 2014  (TW) .............................. 103102451 A (51) Int. Cl.
| | |
|---|---|
| *H01L 29/43* | (2006.01) |
| *H01L 29/45* | (2006.01) |
| *H01L 21/336* | (2006.01) |
| *H01L 27/24* | (2006.01) |
| *H01L 45/00* | (2006.01) |
| *H01L 29/788* | (2006.01) |
| *H01L 29/792* | (2006.01) |

(52) U.S. Cl.
CPC .......... *H01L 27/2463* (2013.01); *H01L 29/788* (2013.01); *H01L 29/792* (2013.01); *H01L 45/122* (2013.01); *H01L 45/145* (2013.01); *H01L 45/146* (2013.01); *H01L 45/1608* (2013.01); *H01L 45/1641* (2013.01)

(58) Field of Classification Search
None
See application file for complete search history.

(56) References Cited

U.S. PATENT DOCUMENTS

| | | | |
|---|---|---|---|
| 8,107,274 B2 | 1/2012 | Lin et al. | |
| 2009/0323387 A1* | 12/2009 | Lin et al. | 365/94 |
| 2011/0026297 A1* | 2/2011 | Lin et al. | 365/148 |
| 2014/0175365 A1* | 6/2014 | Chang et al. | 257/4 |
| 2015/0060749 A1* | 3/2015 | Nakakubo et al. | 257/2 |

* cited by examiner

*Primary Examiner* — Joseph Schoenholtz
(74) *Attorney, Agent, or Firm* — WPAT, PC; Justin King (57) ABSTRACT

A method for manufacturing a resistive element of a non-volatile memory includes the following steps. An insulation layer is formed on a conductive region. The insulation layer is etched to form a via in the insulation layer, wherein a bottom of the via is contacted with a top surface of the conductive region. A dielectric layer is formed on an inner wall and the bottom of the via. A barrier layer is formed on the dielectric layer. A metal layer is filled into the via. The dielectric layer and the barrier layer are reacted with each other to form a transition layer.

32 Claims, 7 Drawing Sheets

RESISTIVE ELEMENT AND MEMORY CELL OF NON-VOLATILE MEMORY AND MANUFACTURING METHOD THEREOF

This application claims the benefit of Taiwan Patent Application No. 103102451, filed Jan. 23, 2014, the subject matter of which is incorporated herein by reference.

FIELD OF THE INVENTION

The present invention relates to a memory and a manufacturing method thereof, and more particularly to a resistive element and a memory cell of a non-volatile memory and a manufacturing method thereof.

BACKGROUND OF THE INVENTION

As is well known, a non-volatile memory is able to continuously retain data after the supplied power is interrupted. A flash memory is one of the most popular non-volatile memories. Generally, each storage cell of the flash memory has a floating gate transistor. The storing status of the floating gate transistor may be determined according to the amount of the stored charges.

Recently, a novel non-volatile memory with a resistive element as the main storage element has been introduced into the market. This non-volatile memory is also referred as a resistive random access memory (RRAM).

Figure 1:
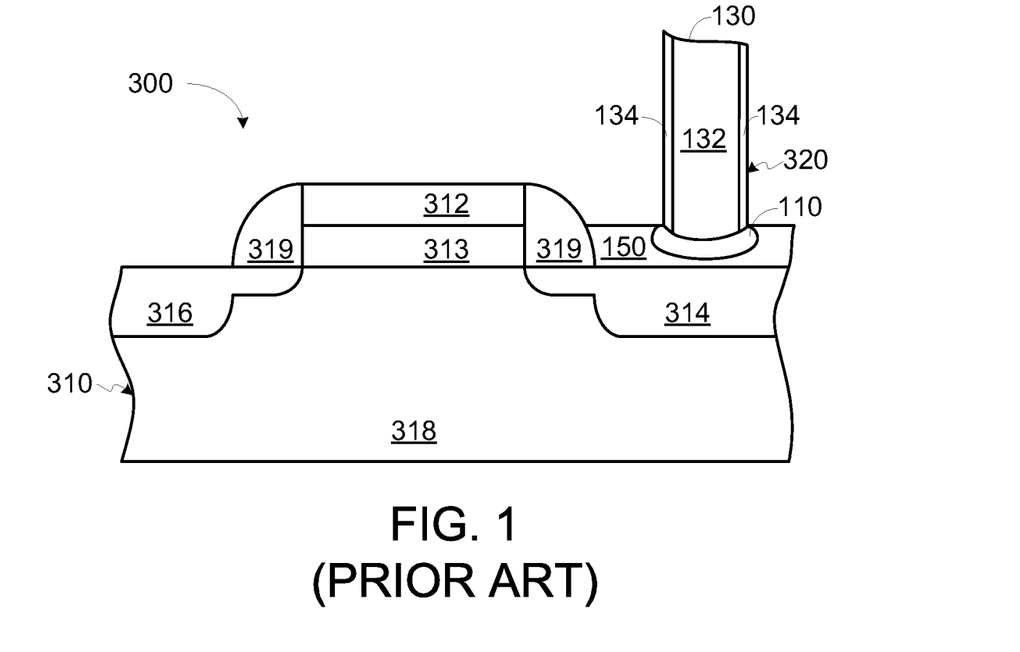
FIG. 1 (prior art) is a schematic cross-sectional view illustrating a conventional non-volatile memory with a resistive element.

FIG. 1 is a schematic cross-sectional view illustrating a conventional non-volatile memory with a resistive element. This non-volatile memory is disclosed in U.S. Pat. No. 8,107,274 for example. As shown in FIG. 1, the non-volatile memory 300 has a (1T+1R) cell. The term "1T" denotes one transistor. The term "1R" denotes one resistor. That is, the non-volatile memory 300 comprises a transistor 310 and a resistive element 320. The resistive element 320 is connected to the transistor 310. In addition, the resistive element 320 is a variable and reversible resistive element, and the transistor 310 is a switch transistor. When the transistor 310 is turned on, the resistive element 320 may be programmed or the storing status of the resistive element 320 may be read.

The transistor 310 comprises a substrate 318, a gate dielectric layer 313, a gate electrode 312, a first source/drain region 314, a second source/drain region 316, and a spacer 319. The substrate 318 may be a well region.

The resistive element 320 comprises a transition metal oxide layer 110, a dielectric layer 150, and a conductive plug module 130. The dielectric layer 150 is formed on the first source/drain region 314. The conductive plug module 130 is disposed on the transition metal oxide layer 110.

The conductive plug module 130 comprises a metal plug 132 and a barrier layer 134. The metal plug 132 is vertically disposed over the transition metal oxide layer 110, and electrically connected with the transition metal oxide layer 110. The barrier layer 134 is arranged around the metal plug 132. The transition metal oxide layer 110 is formed by reacting a portion of the dielectric layer 150 with the barrier layer 134. Moreover, the resistance values of the transition metal oxide layer 110 in a set status and a reset status are different. Each of the resistance values is correlated with a corresponding storing status. Consequently, the transition metal oxide layer 110 has the memory function.

Figure 2A:
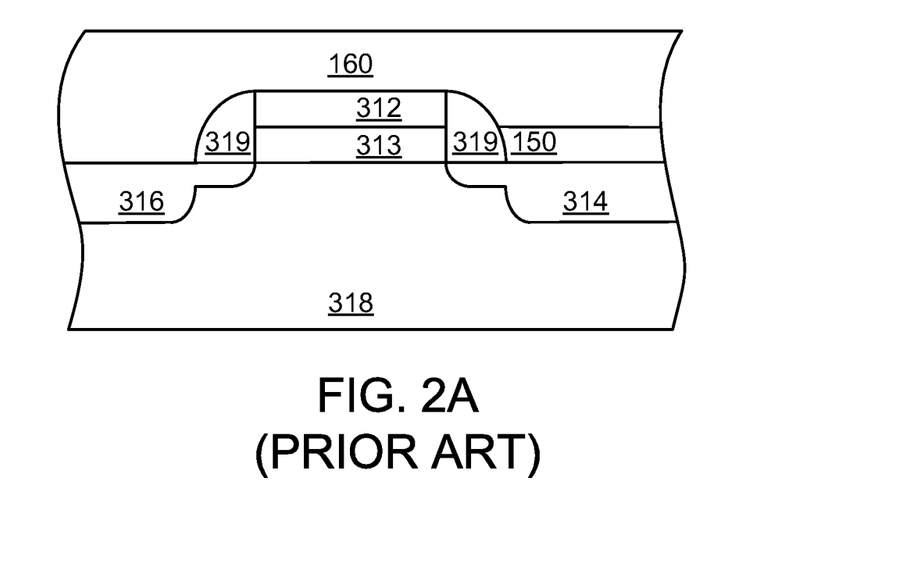
FIGS. 2A~2D (prior art) schematically illustrate a method of manufacturing a conventional non-volatile memory.

FIGS. 2A~2D schematically illustrate a method of manufacturing a conventional non-volatile memory. As shown in FIG. 2A, a transistor is provided. For clarification and brevity, the procedures of fabricating the transistor are not described herein. The transistor comprises a gate electrode 312, a first source/drain region 314, and a second source/drain region 316. Moreover, a gate dielectric layer 313 is formed on the substrate 318 (or the well region), and a gate electrode 312 is formed on the gate dielectric layer 313. The first source/drain region 314 and the second source/drain region 316 are formed in the substrate 318 (or the well region), and located at two opposite side with respect to the gate electrode 312. The spacer 391 is located at the sidewall of the gate electrode 312. Moreover, the dielectric layer 150 is formed on the first source/drain region 314. An interlayer insulating layer 160 is formed on the dielectric layer 150 and the transistor.

Figure 2B:
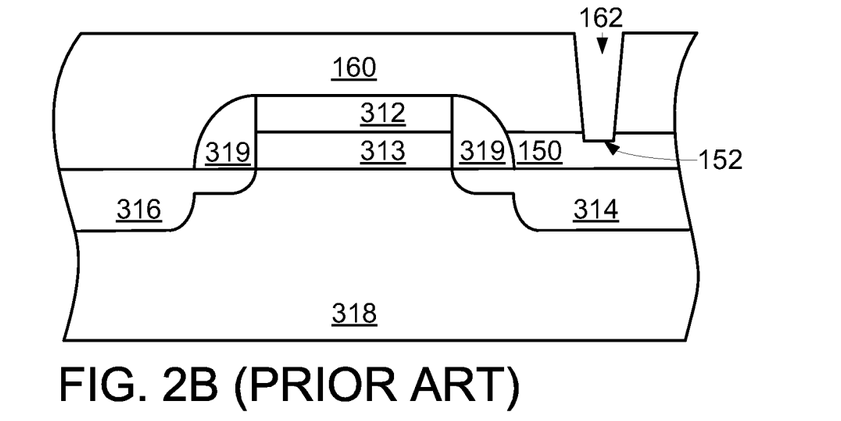

Then, as shown in FIG. 2B, an etching process is performed to form an opening 162 in the interlayer insulating layer 160 and a part of the dielectric layer 150. Meanwhile, the remaining dielectric layer 150 is arranged between a bottom 152 of the opening 162 and the first source/drain region 314.

Figure 2C:
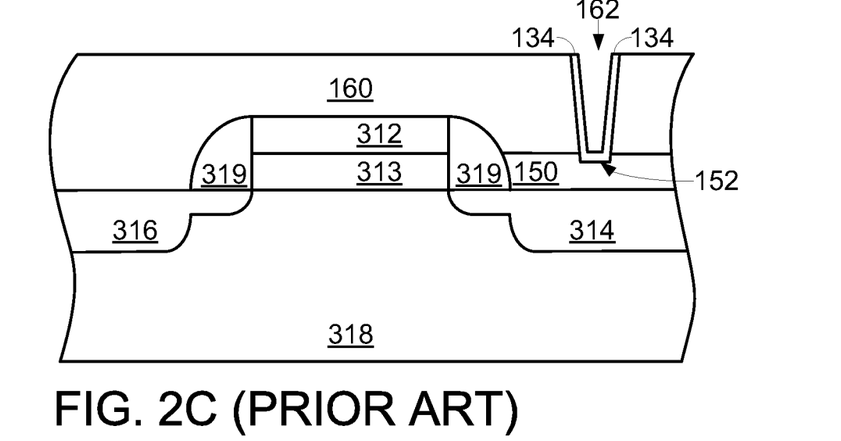

Then, as shown in FIG. 2C, a barrier layer 134 is formed on an inner wall and the bottom 152 of the opening 162.

Figure 2D:
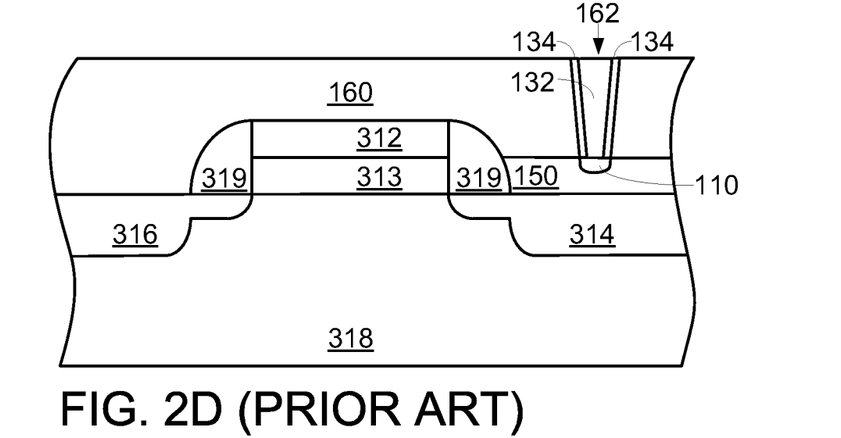

As shown in FIG. 2D, the barrier layer 134 at the bottom 152 of the opening 162 and the dielectric layer 150 are contacted and reacted with each other to produce a transition metal oxide layer 110. After the transition metal oxide layer 110 is formed, a part of the dielectric layer 150 is still arranged between the transition metal oxide layer 110 and the first source/drain region 314. Moreover, a metal plug 132 is filled into the opening 162. The metal plug 132 is electrically connected with the transition metal oxide layer 110.

However, it is difficult to control the etching process of the opening 162. Consequently, the thickness of the remaining dielectric layer 150 at the bottom 152 of the opening 162 cannot be precisely controlled. Under this circumstance, the resistance value of the transition metal oxide layer 110 after the reaction is usually inconsistent. In other words, it is difficult to produce the (1T+1R) cells of the conventional non-volatile memory on large scale.

SUMMARY OF THE INVENTION

An embodiment of the present invention provides a method for manufacturing a resistive element of a non-volatile memory. An insulation layer is formed on a conductive region. The insulation layer is etched to form a via in the insulation layer, wherein a bottom of the via is contacted with a top surface of the conductive region. A dielectric layer is formed on an inner wall and the bottom of the via. A barrier layer is formed on the dielectric layer. A metal layer is filled into the via. The dielectric layer and the barrier layer are reacted with each other to form a transition layer.

Another embodiment of the present invention provides a resistive element of a non-volatile memory. The resistive element includes a conductive region, an insulation layer, a via, a dielectric layer, a barrier layer, and a metal layer. The conductive region has a top surface. The insulation layer is disposed on the top surface of the conductive region. The via is formed in the insulation layer, wherein the conductive region is exposed through a bottom of the via. The dielectric layer is formed on an inner wall and the bottom of the via. The barrier layer is formed on the dielectric layer. The metal layer is filled in the via. The dielectric layer and the barrier layer are reacted with each other to form a transition layer.

Another embodiment of the present invention provides a method for manufacturing a memory cell of a non-volatile memory. Firstly, a transistor is provided. The transistor includes a first source/drain region, a second source/drain region and a gate structure. The first source/drain region and the second source/drain region are formed in a substrate and under a top surface of the substrate. The gate structure is disposed over the top surface of the substrate between the first source/drain region and the second source/drain region. Then, an insulation layer is formed over the first source/drain region. The insulation layer is etched to form a first via in the insulation layer, wherein a bottom of the first via is contacted with the first source/drain region. A dielectric layer is formed on an inner wall and the bottom of the first via. A barrier layer is formed on the dielectric layer. A first metal layer is filled into the first via. The dielectric layer and the barrier layer are reacted with each other to form a transition layer.

Another embodiment of the present invention provides a memory cell of a non-volatile memory. The memory cell includes a substrate, a gate structure, an insulation layer, a first via, a dielectric layer, a barrier layer, and a first metal layer. A first source/drain region and a second source/drain region are formed in the substrate and under a top surface of the substrate. The gate structure is disposed over the top surface of the substrate between the first source/drain region and the second source/drain region. The insulation layer is formed over the first source/drain region. The first via is formed in the insulation layer, wherein the first source/drain region is exposed through a bottom of the first via. The dielectric layer is formed on an inner wall and the bottom of the first via. The barrier layer is formed on the dielectric layer. The first metal layer is filled in the first via. The dielectric layer and the barrier layer are reacted with each other to form a transition layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a resistive element and a memory cell of a non-volatile memory and a manufacturing method thereof. By the manufacturing method of the present invention, the thicknesses of the dielectric layer and the barrier layer can be precisely controlled. Consequently, the fabrication of the non-volatile memory is very stable. Moreover, since the resistance value of the transition layer after the reaction is very consistent, it is feasible to produce the memory cells of the non-volatile memory on large scale. The concepts of the present invention will be illustrated as follows.

FIGS. 3A~3F schematically illustrate a method of manufacturing a resistive element according to an embodiment of the present invention. Firstly, a conductive region 350 is provided, and an insulation layer 360 is formed on the conductive region 350. For example, the conductive region 350 is an N-type substrate, a P-type substrate, an N-type well region and a P-type well region.

Figure 3A:
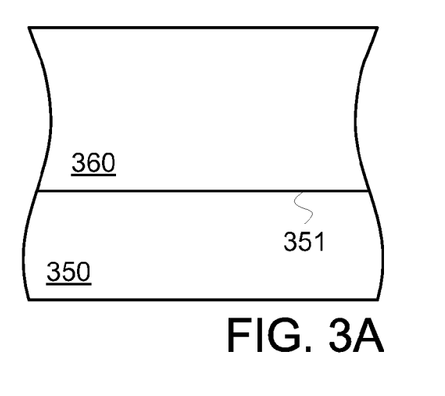
FIGS. 3A~3F schematically illustrate a method of manufacturing a resistive element according to an embodiment of the present invention.
Figure 3B:
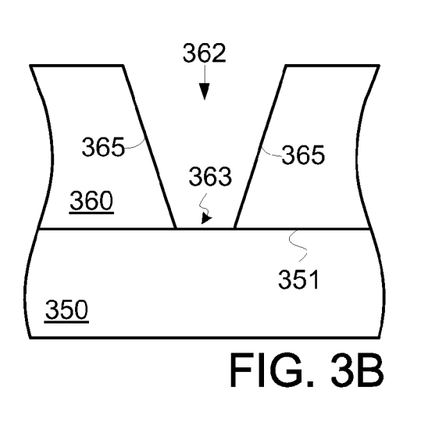

Then, as shown in FIG. 3B, an etching process is performed to form a via 362 in the insulation layer 360. The bottom 363 of the via 362 is contacted with a top surface 351 of the conductive region 350.

Figure 3C:
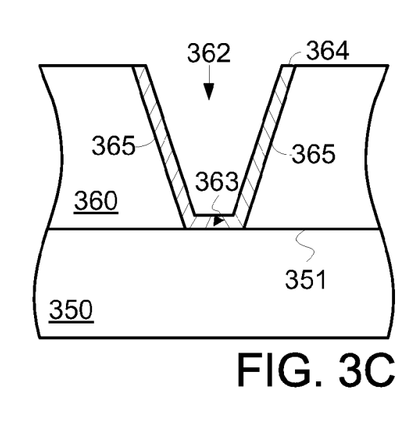

Then, as shown in FIG. 3C, a dielectric layer 364 is formed on an inner wall 365 and the bottom 363 of the via 362.

Figure 3D:
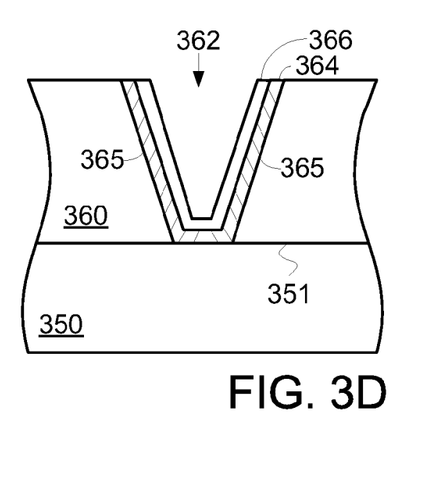

Then, as shown in FIG. 3D, a barrier layer 366 is formed on the inner wall and the bottom of the via 362. That is, the barrier layer 366 is formed on the dielectric layer 364.

Figure 3E:
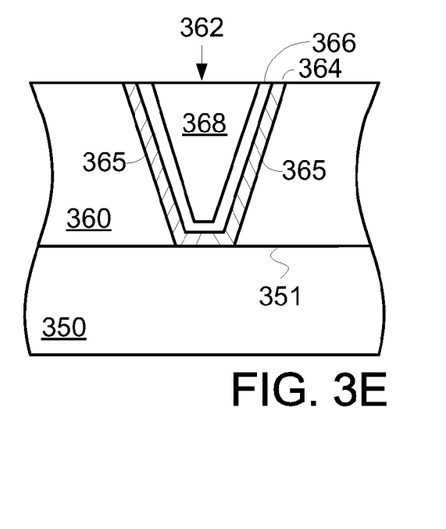

Then, as shown in FIG. 3E, a metal layer 368 is filled into the via 362.

Figure 3F:
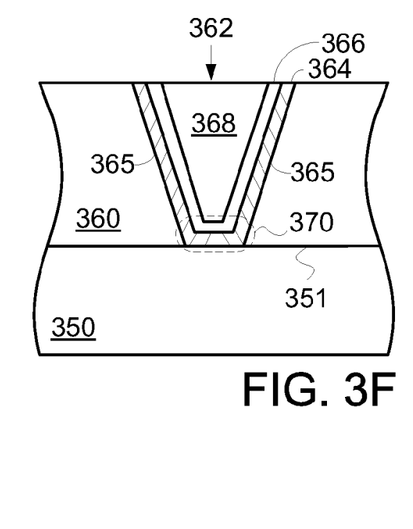

After a reaction is carried out at a high temperature, the resistive element is produced. The structure of the resistive element is shown in FIG. 3F. By this reaction, the barrier layer 366 and the dielectric layer 364 are reacted with each other to form a transition layer 370. Generally, by changing a set status and a reset status of the transition layer 370, the resistance values of the transition layer 370 is adjustable.

In this embodiment, the dielectric layer 364 and the barrier layer 366 are directly formed in the via 362 without the etching process. Consequently, the thicknesses of the dielectric layer 364 and the barrier layer 366 can be precisely controlled, and the fabrication of the non-volatile memory is very stable. Moreover, since the resistance value of the transition layer 370 after the reaction is very consistent, it is feasible to produce the non-volatile memory on large scale.

FIGS. 4A~4G schematically illustrate a method of manufacturing a memory cell of the non-volatile memory according to a first embodiment of the present invention. The memory cell is substantially a combination of a transistor and a resistive element. The resistive element may be fabricated by the above procedures.

Figure 4A:
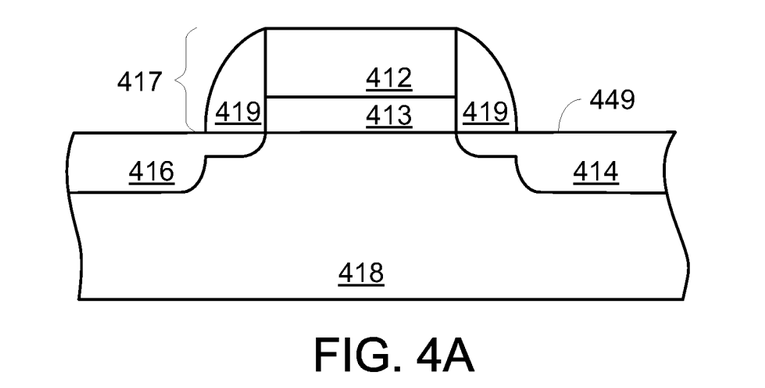
FIGS. 4A~4G schematically illustrate a method of manufacturing a memory cell of the non-volatile memory according to a first embodiment of the present invention.

As shown in FIG. 4A, a transistor is provided. For clarification and brevity, the procedures of fabricating the transistor are not described herein. The transistor comprises a gate structure 417, a first source/drain region 414, and a second source/drain region 416. The first source/drain region 414 and the second source/drain region 416 are conductive regions. Moreover, the gate structure 417 comprises a gate dielectric layer 413, a gate electrode 412, and a spacer 419. The gate dielectric layer 413 is formed on a surface 449 of the substrate 418 (or a well region). The gate electrode 412 is formed on the gate dielectric layer 413. The spacer 419 is formed on sidewalls of the gate electrode 412 and the gate dielectric layer 413. In particular, the gate dielectric layer 413 is disposed over a channel region of the substrate 418 (or the well region). The first source/drain region 414 and the second source/drain region 416 are located at bilateral sides of the channel regions.

Figure 4B:
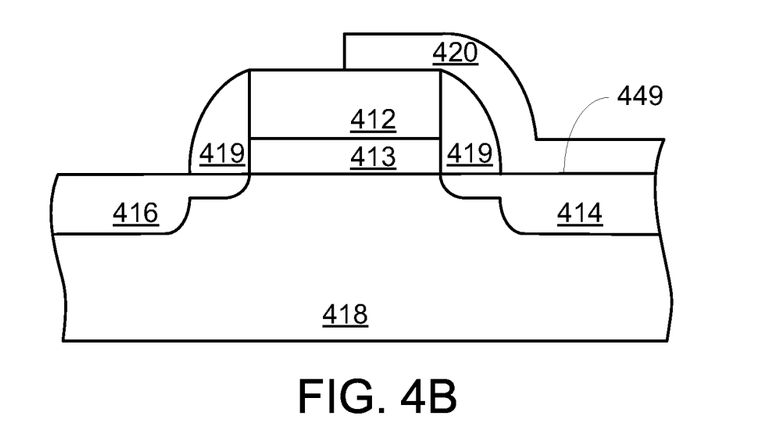

Then, as shown in FIG. 4B, a resist protect oxide (RPO) layer 420 is formed on the first source/drain region 414, a part of the spacer 419 and a part of the gate electrode 412.

Figure 4C:
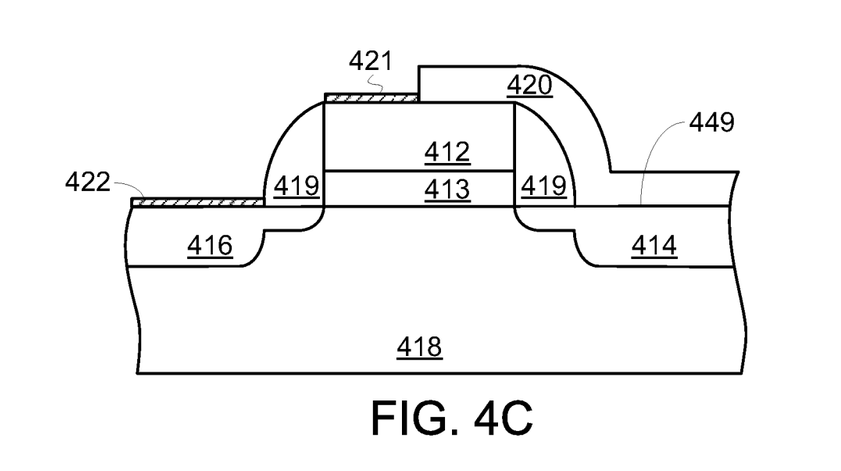

Then, as shown in FIG. 4C, salicide layers 421 and 422 are formed on the surface of the gate electrode 412 and the second source/drain region 416 that are uncovered by the RPO layer 420 and the spacer 419. That is, the first salicide layer 421 is contacted with a part of the surface of the gate electrode 412, and the second salicide layer 422 is contacted with the second source/drain region 416. It is noted that numerous modifications and alterations may be made while retaining the teachings of the invention. For example, in some other embodiments, the RPO layer 420 is formed on the first source/drain region 414 only. Under this circumstance, the first salicide layer 421 is contacted with the entire of the surface of the gate electrode 412.

Figure 4D:
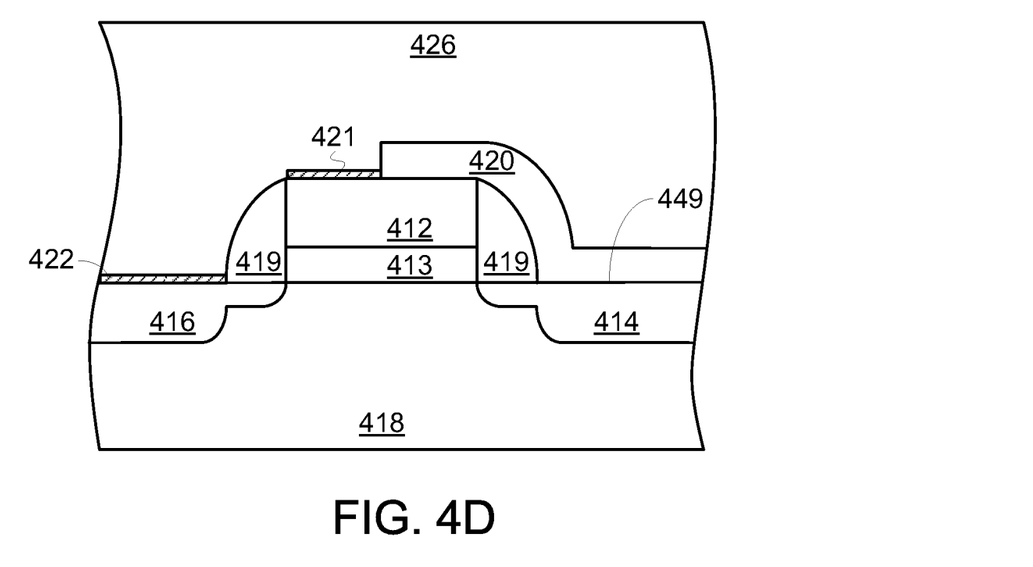

Then, an interlayer insulating layer 426 is formed on the salicide layers 421 and 422, the spacer 419 and the RPO layer 420. In this embodiment, the RPO layer 420 and the interlayer insulating layer 426 are insulation layers.

Figure 4E:
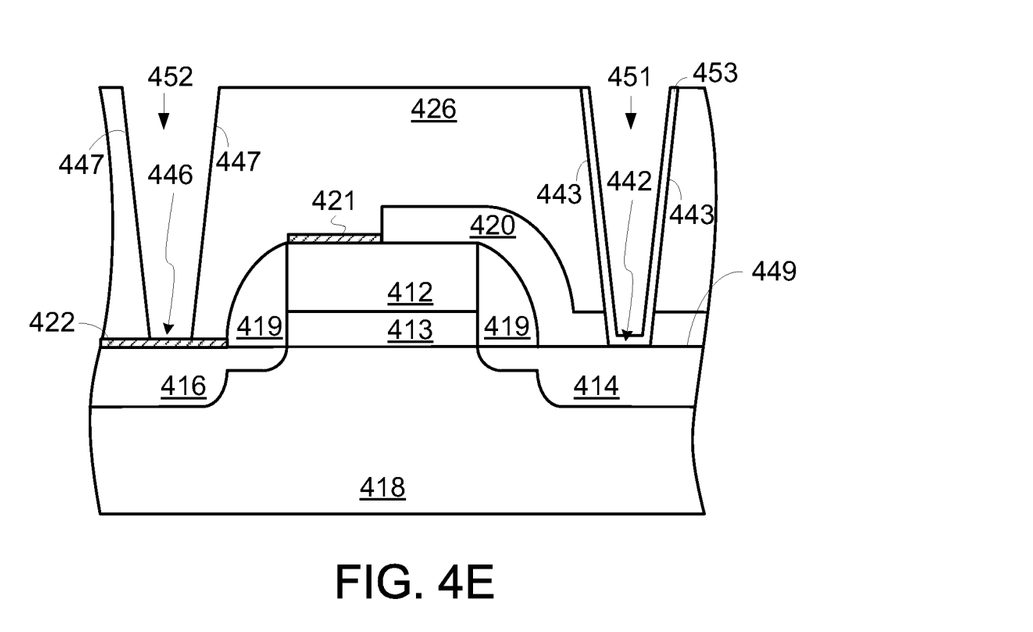

Then, as shown in FIG. 4E, an etching process is performed to form a first via 451 and a second via 452 in the interlayer insulating layer 426. The first via 451 runs through the interlayer insulating layer 426 and the RPO layer 420. In addition, the first via 451 is in contact with the substrate 418 (or the well region), so that the first source/drain region 414 is exposed through the first via 451. The second via 426 runs through the interlayer insulating layer 426. In addition, the second via 452 is in contact with the second salicide layer 422 overlying the second source/drain region 416. Then, a dielectric layer 453 is formed on an inner wall 443 and a bottom 442 of the first via 451.

The procedures of forming the dielectric layer 453 on the inner wall 443 and the bottom 442 of the first via 451 may be altered. In another embodiment, the dielectric layer 453 is simultaneously formed on the inner walls 443, 447 and the bottoms 442, 446 of the first via 451 and the second via 452, then the interlayer insulating layer 426 and the first via 451 (i.e. excluding the second via 452) are covered by a photoresist layer, and the dielectric layer 453 on the inner wall 447 and the bottom 446 of the second via 452 are etched off. Alternatively, in a further embodiment, the interlayer insulating layer 426 and the second via 452 (i.e. excluding the first via 451) is covered by a photoresist layer, and then the dielectric layer 453 is formed on the inner wall 443 and the bottom 442 of the first via 451.

Figure 4F:
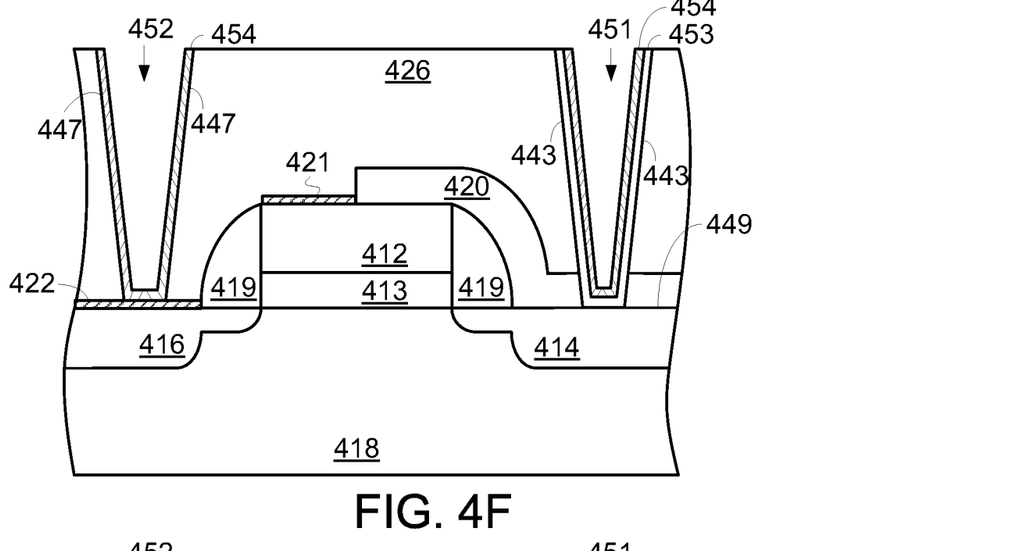

Then, as shown in FIG. 4F, a barrier layer 454 is formed on the inner walls and the bottoms of the first via 451 and the second via 452. That is, the barrier layer 454 within the first via 451 is contacted with the dielectric layer 453, and the barrier layer 454 within the second via 452 is contacted with the interlayer insulating layer 426.

Figure 4G:
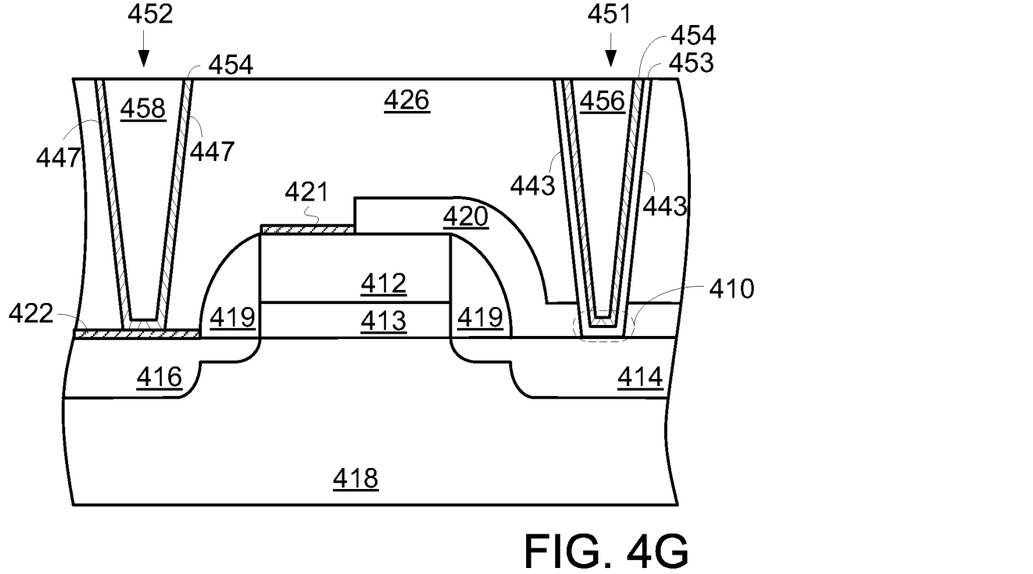

Then, as shown in FIG. 4G, a first metal layer 456 and a second metal layer 458 are filled into the first via 451 and the second via 452, respectively. Meanwhile, the memory cell of the non-volatile memory of the present invention is fabricated.

In this embodiment, the dielectric layer 453, the barrier layer 454 and the first metal layer 456 are sequentially stacked on the bottom of the first via 451. Then, the dielectric layer 453 and the barrier layer 454 are reacted with each other to produce a transition layer 410. Under this circumstance, the first source/drain region 414 is connected to a resistive element.

In this embodiment, the dielectric layer 453 and the barrier layer 454 are directly formed in the first via 451 without the etching process. Consequently, the thicknesses of the dielectric layer 453 and the barrier layer 454 can be precisely controlled, and the fabrication of the non-volatile memory is very stable. Moreover, since the resistance value of the transition layer 410 after the reaction is very consistent, it is feasible to produce the non-volatile memory on large scale.

In the above embodiments, each of the dielectric layers 364 and 453 is made of silicon dioxide ($SiO_2$), each of the barrier layers 366 and 454 is made of Hf, HfOx, HfOxNy, Mg, MgOx, MgOxNy, NiOx, NiOxNy, TaOxNy, Ta, TaOx, TaNx, TiOxNy, Ti, TiOx or TiNx, and each of the transition layers 370 is made of HfOx, HfOxNy, MgOx, MgOxNy, NiOx, NiOxNy, TaOxNy, TaOx, TaNx, TiOxNy,TiOx or TiNx. Among these materials, HfOx, MgOx, NiOx, TaOx and TiOx are transition metal oxides, TaNx and TiNx are transition metal nitrides, and HfOxNy, MgOxNy, NiOxNy, TaOxNy and TiOxNy are transition metal nitrogen oxide dielectric materials. Moreover, each of the metal layers 368, 456 and 458 is made of copper, aluminum or tungsten.

Figure 4H:
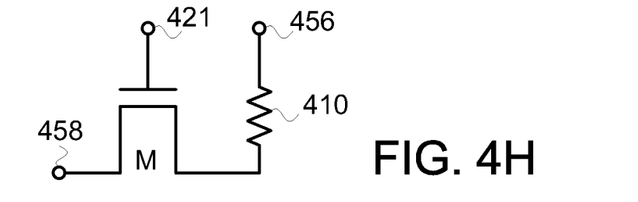
FIG. 4H schematically illustrates an equivalent circuit of the memory cell of the resistive non-volatile memory according to the first embodiment of the present invention.

FIG. 4H schematically illustrates an equivalent circuit of the memory cell of the resistive non-volatile memory according to the first embodiment of the present invention. A first end of the transition layer 410 is connected to the first metal layer 456. A second end of the transition layer 410 is connected to the first source/drain region 414 of the transistor M. The second source/drain region 416 of the transistor M is connected to the second metal layer 458 through the second salicide layer 422. The gate electrode 412 of the transistor M is connected to the first salicide layer 421.

From the above descriptions, the thicknesses of the dielectric layer 453 and the barrier layer 454 over the first source/drain region 414 can be precisely controlled. Consequently, the resistance value of the transition layer 410 can be correspondingly controlled.

It is noted that the transistor is not restricted to the switch transistor. For example, in some other embodiments, the transistor is a floating gate transistor or a silicon-oxide-nitride-oxide-silicon (SONOS) transistor.

Figure 5A:
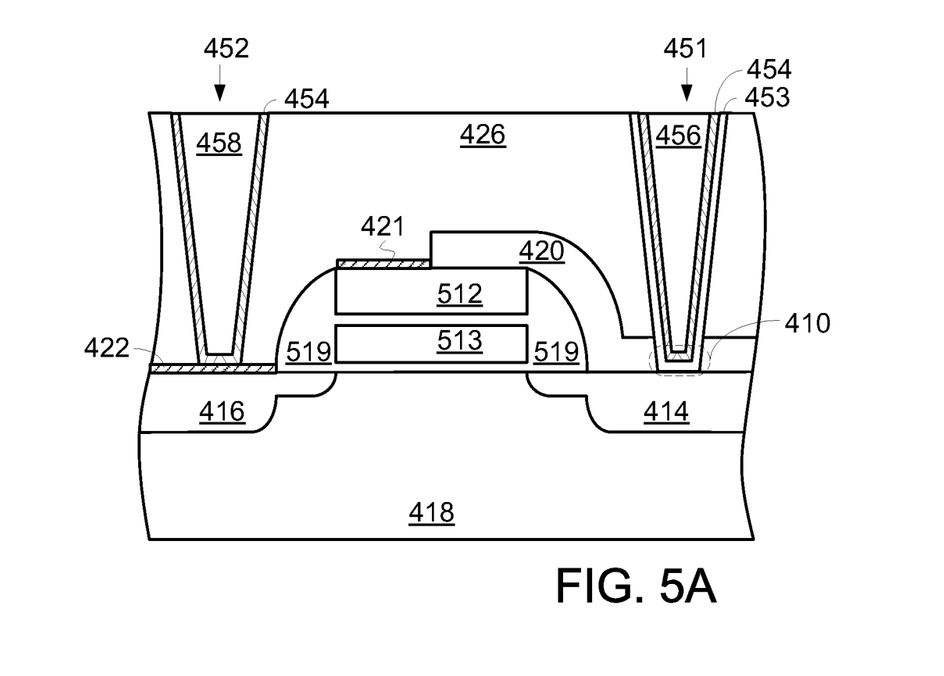
FIG. 5A is a schematic cross-sectional view illustrating a memory cell of a non-volatile memory according to a second embodiment of the present invention.

FIG. 5A is a schematic cross-sectional view illustrating a memory cell of a non-volatile memory according to a second embodiment of the present invention. In this embodiment, the transistor is a floating gate transistor. In comparison with the first embodiment, the gate structure is distinguished. After the floating gate transistor is provided, the above procedures are performed to form the transition layer 410 and the first metal layer 456, which are connected with the floating gate transistor. These procedures are similar to those of the first embodiment, and are not redundantly described herein.

As shown in FIG. 5A, the gate structure of the floating gate transistor comprises two gate electrodes 512, 513 and a spacer 519. The gate electrode 512 is a control gate electrode, and the gate electrode 513 is a floating gate electrode. The gate electrode 512 is disposed over the gate electrode 513. Moreover, the gate electrode 512 and the gate electrode 513 are separated from each other. The gate electrode 512 is contacted with the first salicide layer 421. In addition, the spacer 519 is arranged around the gate electrode 512 and the gate dielectric layer 513.

Figure 5B:
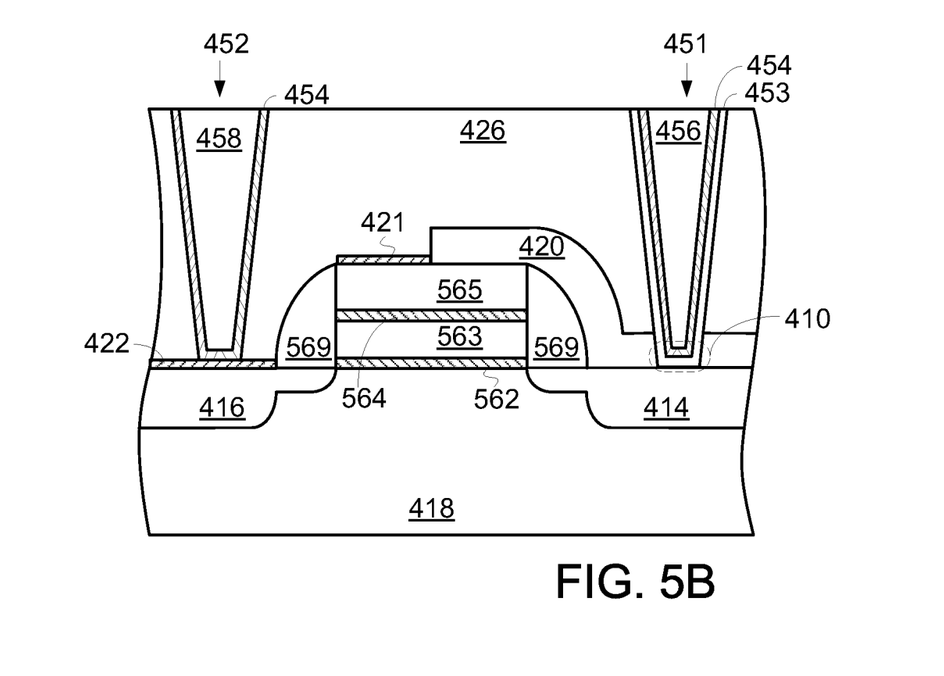
FIG. 5B is a schematic cross-sectional view illustrating a memory cell of a non-volatile memory according to a third embodiment of the present invention.

FIG. 5B is a schematic cross-sectional view illustrating a memory cell of a non-volatile memory according to a third embodiment of the present invention. In this embodiment, the transistor is a SONOS transistor. After the SONOS transistor is provided, the above procedures are performed to form the transition layer 410 and the first metal layer 456, which are connected with the SONOS transistor. These procedures are similar to those of the first embodiment, and are not redundantly described herein.

As shown in FIG. 5B, the gate structure of the SONOS transistor comprises a first oxide layer 562, a nitride layer 563, a second oxide layer 564, and a gate electrode 565. For example, the first oxide layer 562 and the second oxide layer 564 are made of silicon dioxide (SiO₂), the nitride layer 563 is made of silicon dioxide (Si₃N₄), and the gate electrode 565 is made of polysilicon. In other words, the materials of the gate structure from the gate electrode 565 to the substrate 418 are sequentially the semiconductor material, the oxide material, the nitride material, the oxide material and the semiconductor material. Consequently, this transistor is referred as the SONOS transistor.

In the above embodiments, the second source/drain region 416 of the transistor is connected to the second metal layer 458 through the second salicide layer 422, and the gate electrode 412 of the transistor is connected to the first salicide layer 421. It is noted that numerous modifications and alterations may be made while retaining the teachings of the invention. In other words, different metal layers may be formed by other fabricating process, and the metal layers are connected to the second source/drain region 416 and the gate electrode 412.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a resistive element of a non-volatile memory, the method comprising steps of:
   (a) forming an insulation layer on a conductive region;
   (b) etching the insulation layer to form a via in the insulation layer, wherein a bottom of the via is contacted with a top surface of the conductive region;
   (c) forming a dielectric layer on an inner wall and the bottom of the via;
   (d) forming a barrier layer on the dielectric layer;
   (e) filling a metal layer into the via; and
   (f) reacting the dielectric layer and the barrier layer with each other to form a transition layer.

2. The method as claimed in claim 1, wherein the dielectric layer is made of silicon dioxide.

3. The method as claimed in claim 2, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

4. The method as claimed in claim 2, wherein the transition layer is made of HfOx, HfOxNy, MgOx, MgOxNy, NiOx, NiOxNy, TaOxNy, TaOx, TaNx, TiOxNy, TiOx or TiNx.

5. The method as claimed in claim 1, wherein the metal layer is made of copper, aluminum or tungsten.

6. A resistive element of a non-volatile memory, the resistive element comprising:
   a conductive region having a top surface;
   an insulation layer disposed on the top surface of the conductive region;
   a via formed in the insulation layer, wherein a bottom of the via is contacted with a top surface of the conductive region;
   a transition layer formed on the bottom of the via and contacted with the conductive region;
   a dielectric layer formed on an inner wall of the via and contacted with the transition layer;
   a barrier layer formed on the dielectric layer and contacted with the transition layer; and
   a metal layer filled in the via, wherein the barrier layer surrounds the metal layer and the dielectric layer surrounds the barrier layer.

7. The resistive element as claimed in claim 6, wherein the dielectric layer is made of silicon dioxide.

8. The resistive element as claimed in claim 7, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

9. The resistive element as claimed in claim 7, wherein the transition layer is made of HfOx, HfOxNy, MgOx, MgOxNy, NiOx, NiOxNy, TaOxNy, TaOx, TaNx, TiOxNy, TiOx or TiNx.

10. The resistive element as claimed in claim 6, wherein the metal layer is made of copper, aluminum or tungsten.

11. A method for manufacturing a memory cell of a non-volatile memory, the method comprising steps of:
    (a) providing a transistor, wherein the transistor comprises a first source/drain region, a second source/drain region and a gate structure, wherein the first source/drain region and the second source/drain region are formed in a substrate and under a top surface of the substrate, and the gate structure is disposed over the top surface of the substrate between the first source/drain region and the second source/drain region;
    (b) forming an insulation layer over the first source/drain region;
    (c) etching the insulation layer to form a first via in the insulation layer, wherein a bottom of the first via is contacted with the first source/drain region;
    (d) forming a dielectric layer on an inner wall and the bottom of the first via;
    (e) forming a barrier layer on the dielectric layer;
    (f) filling a first metal layer into the first via; and
    (g) reacting the dielectric layer and the barrier layer with each other to form a transition layer.

12. The method as claimed in claim 11, wherein the step (a) comprises:
    (a1) forming a gate dielectric layer on the top surface of the substrate;
    (a2) forming a gate electrode on the gate dielectric layer; and
    (a3) forming a spacer on sidewalls of the gate electrode and the gate dielectric layer, wherein the gate structure comprises the gate dielectric layer, the gate electrode and the spacer.

13. The method as claimed in claim 12, wherein the step (b) comprises:
    (b1) forming a resist protect oxide layer on the first source/drain region, a part of the spacer and a part of the gate electrode;
    (b2) forming a first salicide layer on the gate electrode that is not covered by the resist protect oxide layer, and forming a second salicide layer on the second source/drain region; and
    (b3) forming an interlayer insulating layer on the resist protect oxide layer, the spacer, the first salicide layer and the second salicide layer,
    wherein the resist protect oxide layer and the interlayer insulating layer are collaboratively defined as the insulation layer.

14. The method as claimed in claim 13, further comprising steps:
    (c1) etching the interlayer insulating layer to form a second via in the interlayer insulating layer, wherein a bottom of the second via is contacted with the second salicide layer;

(d1) forming the barrier layer on an inner wall and the bottom of the second via; and
(e1) filling a second metal layer into the second via.

15. The method as claimed in claim 12, wherein the step (b) comprises:
(b1) forming a resist protect oxide layer on the first source/drain region;
(b2) forming a first salicide layer on the gate electrode, and forming a second salicide layer on the second source/drain region; and
(b3) forming an interlayer insulating layer on the resist protect oxide layer, the spacer, the first salicide layer and the second salicide layer,
wherein the resist protect oxide layer and the interlayer insulating layer are collaboratively defined as the insulation layer.

16. The method as claimed in claim 15, further comprising steps:
(c1) etching the interlayer insulating layer to form a second via in the interlayer insulating layer, wherein a bottom of the second via is contacted with the second salicide layer;
(d1) forming the barrier layer on an inner wall and the bottom of the second via; and
(e1) filling a second metal layer into the second via.

17. The method as claimed in claim 11, wherein the step (a) comprises:
(a1) forming a floating gate electrode over the top surface of the substrate;
(a2) forming a control gate electrode over the floating gate electrode, wherein the control gate electrode and the floating gate electrode are separated from each other; and
(a3) forming a spacer on sidewalls of the control gate electrode and the floating gate electrode, wherein the gate structure comprises the floating gate electrode, the control gate electrode and the spacer.

18. The method as claimed in claim 11, wherein the step (a) comprises:
(a1) forming a first oxide layer on the top surface of the substrate;
(a2) forming a nitride layer on the first oxide layer;
(a3) forming a second oxide layer on the nitride layer;
(a4) forming a gate electrode on the second oxide layer; and
(a5) forming a spacer on sidewalls of the gate electrode, the second oxide layer, the nitride layer and the first oxide layer, wherein the gate structure comprises the first oxide layer, the nitride layer, the second oxide layer, the gate electrode and the spacer.

19. The method as claimed in claim 11, wherein the dielectric layer is made of silicon dioxide.

20. The method as claimed in claim 19, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

21. The method as claimed in claim 19, wherein the transition layer is made of HfOx, HfOxNy, MgOx, MgOxNy, NiOx, NiOxNy, TaOxNy, TaOx, TaNx, TiOxNy, TiOx or TiNx.

22. The method as claimed in claim 11, wherein the first metal layer is made of copper, aluminum or tungsten.

23. A memory cell of a non-volatile memory, the memory cell comprising:
a substrate, wherein a first source/drain region and a second source/drain region are formed in the substrate and under a top surface of the substrate;
a gate structure disposed over the top surface of the substrate between the first source/drain region and the second source/drain region;
an insulation layer formed over the first source/drain region;
a first via formed in the insulation layer, wherein a bottom of the first via is contacted with the first source/drain region;
a transition layer formed on the bottom of the first via and contacted with the first source/drain region;
a dielectric layer formed on an inner wall of the first via and contacted with the transition layer;
a barrier layer formed on the dielectric layer and contacted with the transition layer; and
a first metal layer filled in the first via, wherein the barrier layer surrounds the metal layer and the dielectric layer surrounds the barrier layer.

24. The memory cell as claimed in claim 23, wherein the gate structure comprises:
a gate dielectric layer formed on the top surface of the substrate;
a gate electrode formed on the gate dielectric layer; and
a spacer formed on sidewalls of the gate electrode and the gate dielectric layer.

25. The memory cell as claimed in claim 24, further comprising:
a resist protect oxide layer formed on the first source/drain region, a part of the spacer and a part of the gate electrode;
a first salicide layer formed on the gate electrode that is not covered by the resist protect oxide layer;
a second salicide layer formed on the second source/drain region;
an interlayer insulating layer formed on the resist protect oxide layer, the spacer, the first salicide layer and the second salicide layer;
a second via formed in the interlayer insulating layer, wherein the second salicide layer is exposed through a bottom of the second via;
the barrier layer formed on an inner wall and the bottom of the second via; and
a second metal layer filled in the second via,
wherein the resist protect oxide layer and the interlayer insulating layer are collaboratively defined as the insulation layer.

26. The memory cell as claimed in claim 24, further comprising:
a resist protect oxide layer formed on the first source/drain region;
a first salicide layer formed on the gate electrode;
a second salicide layer formed on the second source/drain region;
an interlayer insulating layer formed on the resist protect oxide layer, the spacer, the first salicide layer and the second salicide layer;
a second via formed in the interlayer insulating layer, wherein the second salicide layer is exposed through a bottom of the second via;
the barrier layer formed on an inner wall and the bottom of the second via; and
a second metal layer filled in the second via,
wherein the resist protect oxide layer and the interlayer insulating layer are collaboratively defined as the insulation layer.

27. The memory cell as claimed in claim 23, wherein the dielectric layer is made of silicon dioxide.

28. The memory cell as claimed in claim 27, wherein the barrier layer is made of Hf, HfOx, HfOxNy, Mg, MgOx, MgOxNy, NiOx, NiOxNy, TaOxNy, Ta, TaOx, TaNx, TiOxNy, Ti, TiOx or TiNx.

29. The memory cell as claimed in claim 27, wherein the transition layer is made of HfOx, HfOxNy, MgOx, MgOxNy, NiOx, NiOxNy, TaOxNy, TaOx, TaNx, TiOxNy, TiOx or TiNx.

30. The memory cell as claimed in claim 23, wherein the first metal layer is made of copper, aluminum or tungsten.

31. The memory cell as claimed in claim 23, wherein the gate structure comprises:
   a floating gate electrode formed over the top surface of the substrate;
   a control gate electrode formed over the floating gate electrode, wherein the control gate electrode and the floating gate electrode are separated from each other; and
   a spacer formed on sidewalls of the control gate electrode and the floating gate electrode.

32. The memory cell as claimed in claim 23, wherein the gate structure comprises:
   a first oxide layer formed on the top surface of the substrate;
   a nitride layer formed on the first oxide layer;
   a second oxide layer formed on the nitride layer;
   a gate electrode formed on the second oxide layer; and
   a spacer formed on sidewalls of the gate electrode, the second oxide layer, the nitride layer and the first oxide layer.

* * * * *